(12) United States Patent
Takano

(10) Patent No.: US 12,716,937 B2
(45) Date of Patent: Aug. 25, 2026

(54) SYSTEMS AND METHODS FOR MEASURING WAVEFORMS AT DEVICES UNDER TEST

(71) Applicant: Keysight Technologies, Inc., Santa Rosa, CA (US)

(72) Inventor: Kenichi Takano, Tokyo (JP)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 153 days.

(21) Appl. No.: 18/680,887

(22) Filed: May 31, 2024

(65) Prior Publication Data

US 2025/0370030 A1 Dec. 4, 2025

(51) Int. Cl.
*G01R 31/28* (2006.01)
*G01R 13/02* (2006.01)
*G01R 31/08* (2020.01)
*G01R 31/11* (2006.01)

(52) U.S. Cl.
CPC ..... *G01R 31/2841* (2013.01); *G01R 13/0218* (2013.01); *G01R 31/083* (2013.01); *G01R 31/11* (2013.01)

(58) Field of Classification Search
CPC ........ G01R 31/31924; G01R 31/31926; G01R 31/31937
See application file for complete search history.

(56) References Cited

U.S. PATENT DOCUMENTS 4,947,113 A * 8/1990 Chism ...................... H03K 5/12 327/170
5,519,327 A * 5/1996 Consiglio ............ G01R 31/002 324/754.05
6,396,329 B1 * 5/2002 Zerbe ................... G11C 7/1084 327/333
8,410,804 B1 * 4/2013 Goeke ................ G01R 1/06772 324/755.02
11,693,046 B2 7/2023 Li et al.
2004/0169540 A1 * 9/2004 Iorga .................... H03H 11/265 327/280
2021/0325460 A1 * 10/2021 Jan .......................... H03M 1/12

FOREIGN PATENT DOCUMENTS

CN 115201529 A 10/2022

OTHER PUBLICATIONS

Simbürger, Werner, David Johnsson, and Matthias Stecher. “High current TLP characterisation: An effective tool for the development of semiconductor devices and ESD protection solutions.” ARMMS RF & microwave society (2012): 1-4.
Take the Mystery Out of Probing, 7 Common Oscilloscope Probing Pitfalls to Avoid, eBook, Keysight (Jan. 25, 2023).

* cited by examiner

*Primary Examiner* — Huy Q Phan
*Assistant Examiner* — Temilade S Rhodes-Vivour

(57) ABSTRACT

Methods, systems, and computer readable media for measuring voltage and current waveforms at devices under test. An example method includes outputting an electrical signal from a signal generator of a measurement instrument; measuring a first voltage at an input to an output resistance of the measurement instrument; measuring a second voltage at an output of the output resistance of the measurement instrument; and determining a test measurement voltage at a device under test (DUT) electrically connected to the measurement instrument using the first voltage, the second voltage, and a propagation delay of a transmission line electrically connecting the measurement instrument to the DUT.

16 Claims, 6 Drawing Sheets

SYSTEMS AND METHODS FOR MEASURING WAVEFORMS AT DEVICES UNDER TEST

TECHNICAL FIELD

The subject matter described herein relates to methods, systems, and computer readable media for measuring voltage and current waveforms at devices under test.

BACKGROUND

In the development and manufacturing of semiconductors, the electrical measurement of devices on semiconductor wafers is used to verify their design values and manufacturing quality. Particularly in new semiconductor processes and new types of memory devices, high-frequency measurements are performed to acquire the dynamic characteristics of the devices.

Monitoring the signals at a device under test (DUT) is performed to assure whether the measurement is performed correctly. However, when it comes to measuring the wafer, it is difficult to probe the DUT on the wafer directly because the wafer is covered by a probe card and an enclosure of the measurement equipment. From the perspectives of electrical safety and wafer contamination, the measurement terminals and the wafer surface are not allowed to be exposed to the operator.

When we measure direct current (DC) signals, it is possible to monitor the DUT signal by branching a signal path between a signal source and the DUT. But for the high-frequency measurement, the signal in the middle of the signal path does not match the DUT signal. Such a signal path is treated as a transmission line, and it has a delay and reflected waves. Inappropriate branching would distort the measurement signal. Putting the monitor terminal at the DUT may affect the DUT characteristics. Similarly, the electronic devices located in a test fixture and an environmental chamber can present similar issues.

Accordingly, a need exists for methods, systems, and computer readable media for measuring voltage and current waveforms at devices under test.

SUMMARY

Methods, systems, and computer readable media for measuring voltage and current waveforms at devices under test. An example method includes outputting an electrical signal from a signal generator of a measurement instrument; measuring a first voltage at an input to an output resistance of the measurement instrument; measuring a second voltage at an output of the output resistance of the measurement instrument; and determining a test measurement voltage at a device under test (DUT) electrically connected to the measurement instrument using the first voltage, the second voltage, and a propagation delay of a transmission line electrically connecting the measurement instrument to the DUT.

In some examples, the DUT is a semiconductor device on a semiconductor wafer, and the transmission line includes a coaxial cable. In some examples, measuring the first voltage comprises using a first analog-to-digital converter (ADC) and wherein measuring the second voltage comprises using a second analog-to-digital converter.

Measuring the first voltage can include: closing a first switch between an analog-to-digital converter (ADC) and the input to the output resistance; opening a second switch between the ADC and the output to the output resistance; and measuring the first voltage using the ADC. Measuring the second voltage can include: opening the first switch and closing the second switch; outputting the electrical signal a second time; and measuring the second voltage using the ADC.

The method can include repeatedly outputting the electrical signal, adding an increasing time delay to each output of the electrical signal, and summing a plurality of waveforms captured at each time delay to determine a waveform at the DUT having a shorter sampling period than a configured sampling period of an analog-to-digital converter (ADC) used for measuring the first voltage and the second voltage.

The method can include capturing first and second waveforms for the first and second voltages for a period of time greater than twice the propagation delay of the transmission line.

The method can include measuring the propagation delay of the transmission line using an oscilloscope. Measuring the first voltage or the second voltage or both can include using an oscilloscope.

The method can include measuring a differential signal at the DUT by measuring a third voltage at a second input to a second output resistance and a further voltage at a second output to a second output resistance and using a second propagation delay of a second transmission line.

The computer systems described herein may be implemented in software in combination with hardware and/or firmware. For example, the subject matter described herein may be implemented in software executed by a processor. In one example implementation, the subject matter described herein may be implemented using a non-transitory computer readable medium having stored therein computer executable instructions that when executed by the processor of a computer control the computer to perform steps. Example computer readable media suitable for implementing the subject matter described herein include non-transitory devices, such as disk memory devices, chip memory devices, programmable logic devices, field-programmable gate arrays, and application specific integrated circuits. In addition, a computer readable medium that implements the subject matter described herein may be located on a single device or computer platform or may be distributed across multiple devices or computer platforms.

BRIEF DESCRIPTION OF THE DRAWINGS

The subject matter described herein will now be explained with reference to the accompanying drawings of which.

DETAILED DESCRIPTION

Figure 1:
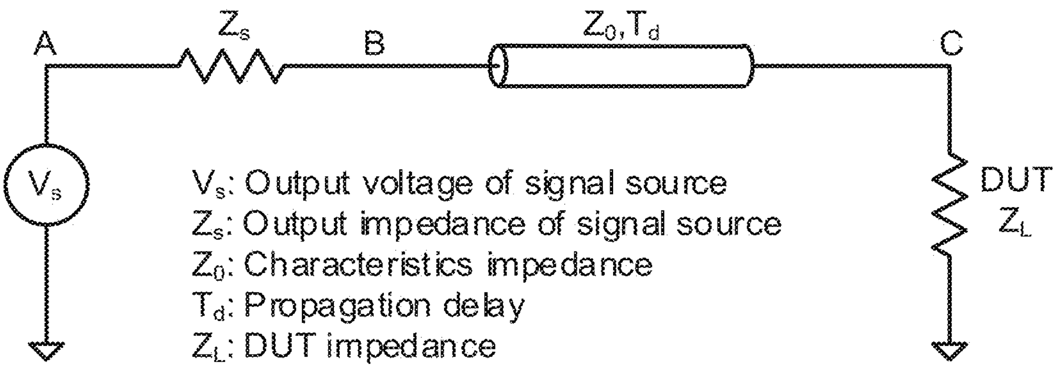
FIG. 1 shows a simplified model for high-frequency measurement of an example device under test (DUT).

FIG. 1 shows a simplified model for high-frequency measurement of an example device under test (DUT). Vs is the signal source, $Z_s$ is an output impedance of the signal source, $Z_0$ is a characteristic impedance of the transmission line between $Z_s$ and DUT, $T_d$ is a delay time of the transmission line, and $Z_L$ is a DUT impedance.

Here, we assume the following condition: $Z_s=Z_0$, $Z_0$ in the transmission line between B and C is uniform, $T_d$ is a known value, and the waveform at A and B can be observed.

In this transmission circuit, the incident wave from $V_s$ is reflected at C and back to $V_s$. The load impedance of $Z_L$ terminating the line with the characteristic impedance of $Z_0$ will have a reflection coefficient of $\Gamma_c$ as follows:

$$\Gamma_C = \frac{Z_L - Z_0}{Z_L + Z_0} \tag{1}$$

The reflected wave back to $V_s$ is reflected again at B and then goes to the DUT. The reflection coefficient of $\Gamma_B$ is:

$$\Gamma_B = \frac{Z_s - Z_0}{Z_s + Z_0} \tag{2}$$

If both $\Gamma_B$ and $\Gamma_C$ are not zero, the waves are reflecting alternately between the transmitting end and the receiving end. This is called "multiple reflection." In this situation, the waveform at the DUT will be different from the source waveform.

We can set $Z_s=Z_0$ so that the $\Gamma_B=0$ and the multiple reflection does not occur. In this case, the standing wave at B can be represented by the incident wave from A and the reflected wave from DUT:

$$V_B(t) = \frac{Z_0}{Z_s + Z_0} V_s(t) + \frac{Z_0}{Z_s + Z_0} V_s(t - 2T_d)\Gamma_C \tag{3}$$

Similarly, the standing wave at C can be represented as follows:

$$V_C(t) = \frac{Z_0}{Z_s + Z_0} V_s(t - T_d) + \frac{Z_0}{Z_s + Z_0} V_s(t - T_d)\Gamma_C \tag{4}$$

Equation (3) and (4) are valid for any arbitrary time t. We can replace t with t-$T_d$ in Equation (4). And then we can derive the following equation by subtracting Equation (4) from (3):

$$V_B(t) - V_C(t - T_d) = \frac{Z_0}{Z_s + Z_0} V_s(t) - \frac{Z_0}{Z_s + Z_0} V_s(t - 2T_d) \tag{5}$$

Transforming this equation, we derive:

$$V_C(t - T_d) = V_B(t) - \frac{1}{2}(V_s(t) - V_s(t - 2T_d)) \tag{6}$$

Equation (6) indicates that the voltage waveform at the DUT can be represented by $V_s$ and $V_B$ with $T_d$. It is easy to monitor $V_s$ and $V_B$ if they are located inside the measurement equipment. This invention utilizes the above theory to estimate the signal at the DUT from information obtained at easily observable measurement points.

The same method can be applied to calculate the current waveform. The current at B and C are:

$$I_B(t) = \frac{1}{Z_0}\left(\frac{Z_0}{Z_s + Z_0} V_s(t) + \frac{Z_0}{Z_s + Z_0} V_s(t - 2T_d)\Gamma_C\right) \tag{7}$$

$$I_C(t) = \frac{1}{Z_0}\left(\frac{Z_0}{Z_s + Z_0} V_s(t - T_d) + \frac{Z_0}{Z_s + Z_0} V_s(t - T_d)\Gamma_C\right) \tag{8}$$

Calculating the same way as mentioned earlier, we derive:

$$I_C(t - T_d) = I_B(t) - \frac{1}{Z_s + Z_0}(V_s(t) - V_s(t - 2T_d)) = \frac{V_s(t) - V_B(t)}{Z_0} - \frac{1}{2Z_0}(V_s(t) - V_s(t - 2T_d)) \tag{9}$$

This indicates that the current waveform at the DUT can be represented by $V_s$ and $V_B$ with $T_d$ and $Z_0$.

Figure 2:
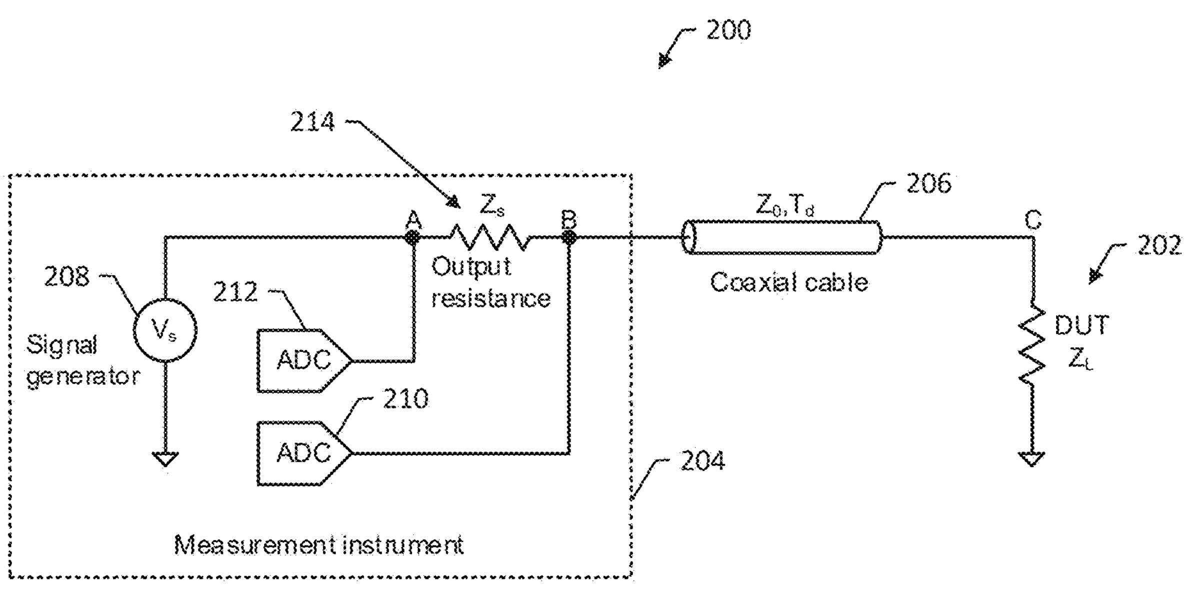
FIG. 2 is a block diagram of an example system for measuring waveforms at an example DUT.

FIG. 2 is a block diagram of an example system 200 for measuring waveforms at an example DUT 202. The system 200 includes a measurement instrument 204 connected to the DUT 202 by a coaxial cable 206. The measurement instrument 204 includes a signal generator 208 and two analog-to-digital converters (ADCs) 210 and 212. The propagation delay Ta of the coaxial cable 206 can be measured, for example, by an oscilloscope before connecting the measurement instrument 204 and the DUT 202.

The measurement instrument has an output resistance 214, and current and/or voltage can be measured at the input to the output resistance 214 (point A) and the output to the output resistance 214 (point B). If the two ADCs 210 and 212 capture the voltage waveform at A and B simultaneously, the voltage and current waveform at the DUT 202 can be calculated using Equation (3). The ADCs 210 and 212 can be configured to capture the waveforms for more than $2T_d$ to obtain a complete measurement.

The signal generator 206 can be constructed using any appropriate components, for example, using a D-to-A converter, a step voltage generator, or a voltage oscillator depending on the application. The ADCs 210 and 212 are configured to have sufficient time resolution and voltage range to capture the waveforms at A and B. The calculation of the voltage and current waveform at the DUT 202 can be performed by any appropriate computing system, for example, by central processing unit (CPU) or field programmable gate array (FPGA).

Figure 3:
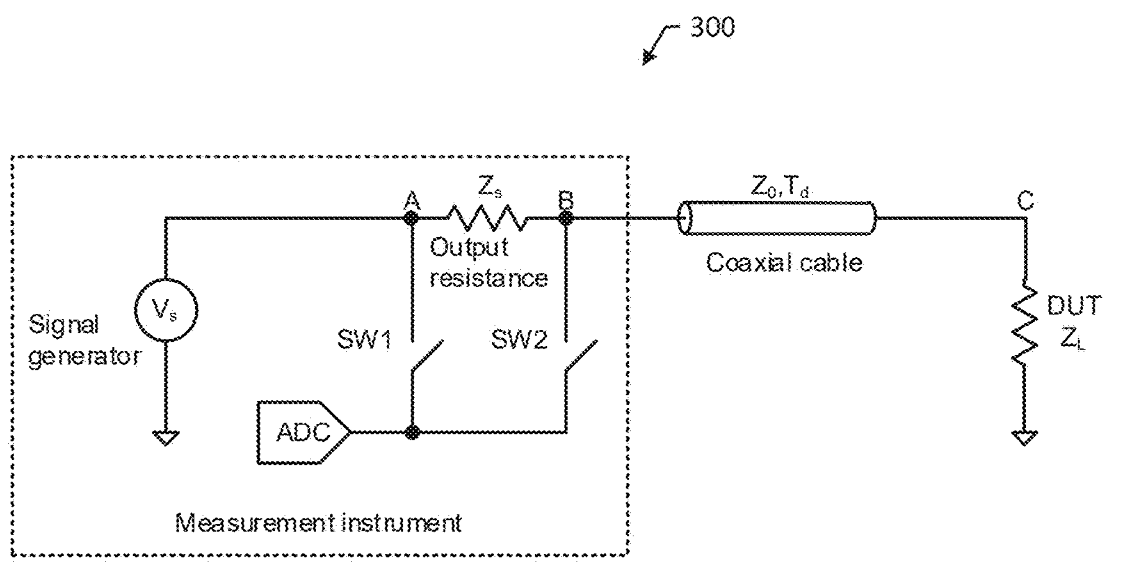
FIG. 3 is a block diagram of another example system for measuring waveforms at an example DUT.

FIG. 3 is a block diagram of another example system 300 for measuring waveforms at an example DUT 202. Compared to the system 200 of FIG. 2, the system 300 of FIG. 3 needs only one ADC 302 and uses two switches 304 and 306 to provide input and output waveforms to the ADC 302.

In the system 300 of FIG. 3, we assume that the waveforms at A, B, and C can be reproducible. In this case, the waveform at A is measured when SW1 is on and SW2 is off. Then the waveform at B is measured when SW1 is off and SW2 is on. This configuration can reduce the number of ADCs needed, which can be useful, for example, to reduce the cost of the system 300.

Suppose that a controller controls the operation of the system 300. The controller may take the following actions in performing a test of the DUT 202:

Cause the first switch SW1 to close and the second switch SW2 to open

Control the signal generator 206 to generate a signal.

Measure, using the ADC 302, the responsive signal at A.
Cause the first switch SW1 to open and the second switch SW2 to close.
Control the signal generator 206 to repeat the same signal.
Measure, using the ADC 302, the responsive signal at B.
Calculate the waveform at C using the measured signals at A and B.

In the example systems 200 and 300 of FIGS. 2 and 3, the waveforms are measured using ADCs. In general, any appropriate circuit can be used; for example, it is possible to use a waveform measurement instrument such as an oscilloscope instead of ADCs.

In the example systems 200 and 300 of FIGS. 2 and 3, it is possible to use a slow sampling rate ADC by using an FPGA (or other appropriate circuit) with a timing vernier if the waveforms at A, B, and C can be reproduced. The timing vernier adds delay time to a sampling clock that drives the ADC. By summing multiple waveforms captured with the delay, the system can determine the waveform with a shorter sampling period than that of the ADC. This can be useful, for example, to reduce the cost of the system by using a slow sampling rate ADC instead of a more expensive and faster sampling ADC.

Figure 4:
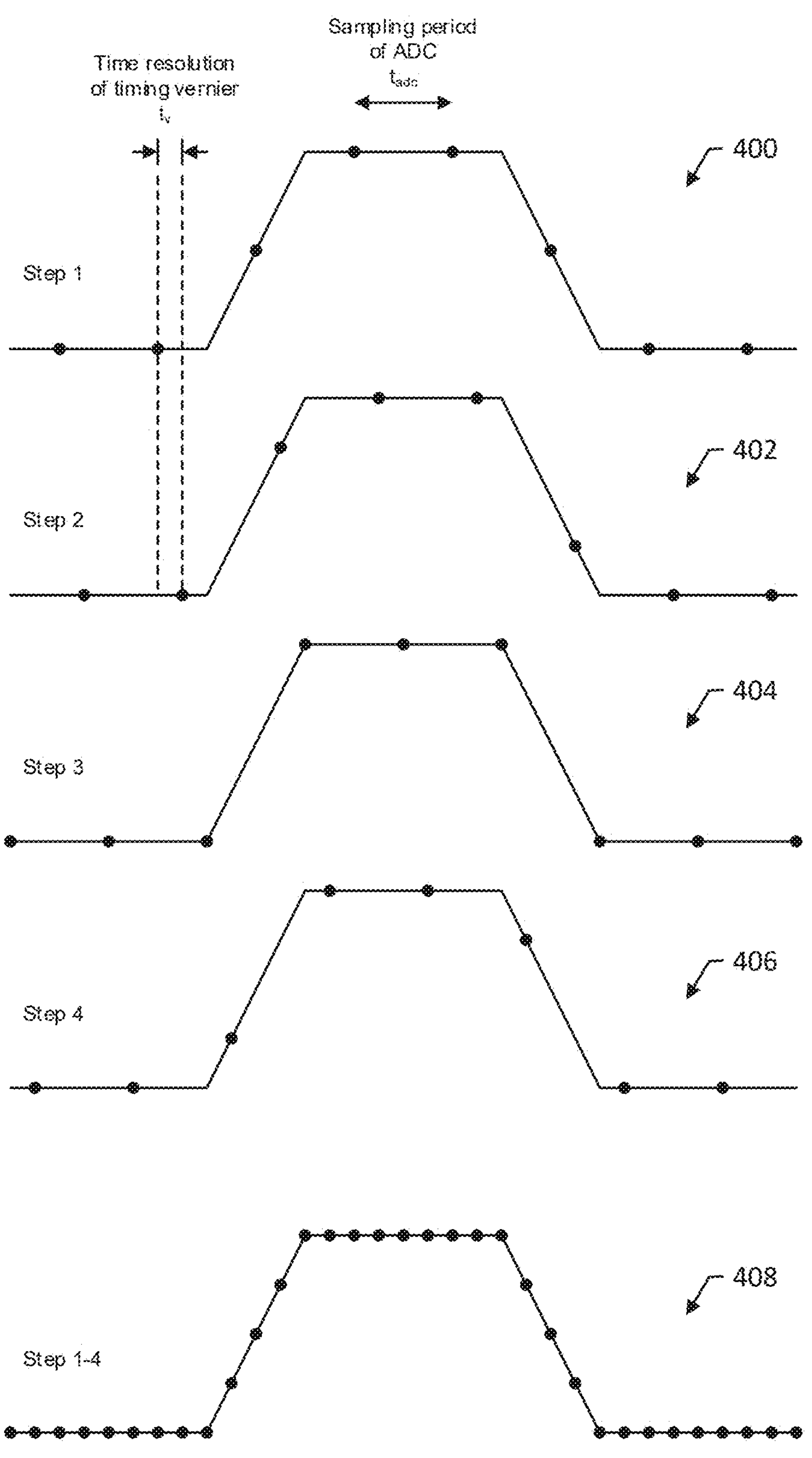
FIG. 4 shows example waveforms illustrating the use of a timing vernier.

FIG. 4 shows example waveforms illustrating the use of a timing vernier. In a first step 400, the signal generator generates a test waveform and the ADC measures a responsive waveform (at the input or output of the output resistance of the measurement instrument). The ADC has a sampling period of $t_{adc}$ and the time resolution of the timing vernier is $t_v$.

In a second step 402, the signal generator repeats the test waveform with a delay time $t_v$ and the ADC measures the responsive waveform again. The delay time $t_v$ is incremented again and again as the signal generator repeats the test waveform again and again in third and fourth steps 404 and 406. The resulting waveform 408 is determined by summing the measured responsive waveforms.

Figure 5:
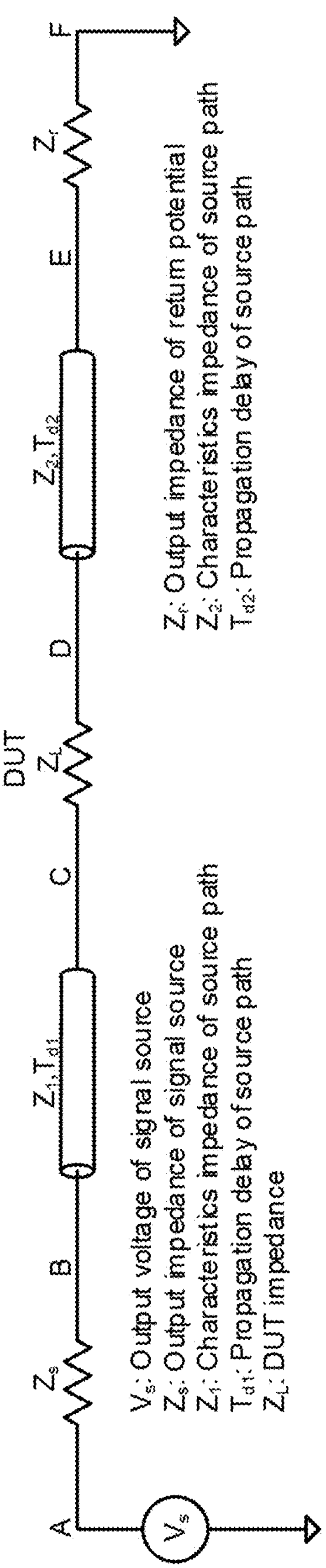
FIG. 5 illustrates the case where both ends of the DUT include the transmission line.

FIG. 5 illustrates the case where both ends of the DUT include the transmission line. Point D in FIG. 5 is the measurement reference provided from the measurement equipment to the DUT, and it is connected to the measurement reference F in the equipment through the output resistance $Z_r$ of the equipment and the transmission line $Z_2$.

We assume the following condition: $Z_s=Z_1$, $Z_r=Z_2$, $Z_1$ and $Z_2$ are uniform in the transmission line, $T_{d1}$ and $T_{d2}$ are known values, and the waveform at A, B, and E can be observed.

In this condition, we can calculate the voltage between C and D as follows.

$$V_C(t-T_{d2}) - V_D(t-T_{d2}) = V_B(t+T_{d1}-T_{d2}) - \frac{1}{2}(V_s(t+T_{d1}-T_{d2}) - V_s(t-T_{d1}-T_{d2})) - V_E(t) \tag{10}$$

This equation indicates that the voltage waveform at the DUT can be represented by $V_s$, $V_B$, and $V_E$ with $T_{d1}$ and $T_{d2}$.

The same method can be applied to calculate the current waveform.

The optional features illustrated above with reference to FIGS. 2-4 can also be applied to the differential system illustrated in FIG. 5.

Figure 6:
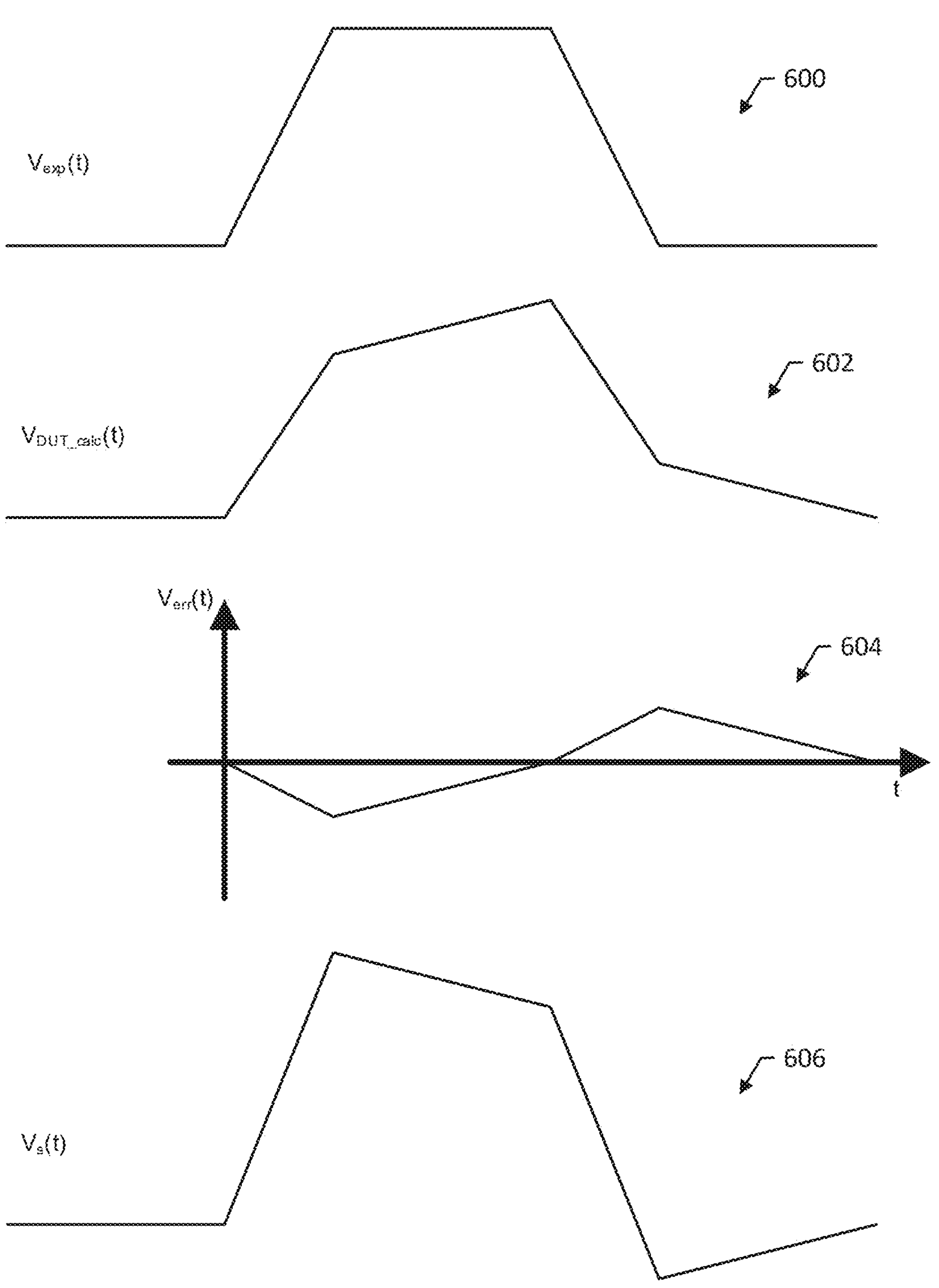
FIG. 6 shows a series of waveforms illustrating an example method for determining the source waveform that produces an expected waveform at the DUT.

FIG. 6 shows a series of waveforms illustrating an example method for determining the source waveform that produces an expected waveform at the DUT. By feeding back the information calculated using the example systems 200 and 300 of FIGS. 2 and 3, it is possible to determine the source waveform. This can be useful, for example, to determine how to configure a signal generator to produce a test waveform that results in the expected waveform arriving at the DUT.

Consider, for example, the system 200 of FIG. 2. An example of the operation flow to generate the source waveform is:

Step 1. Set the expected DUT waveform ($V_{exp}(t)$) to the signal generator as the source waveform ($V_s$ (t)). The top waveform 600 in FIG. 6 illustrates an example $V_{exp}(t)$.

Step 2. Calculate the waveform at DUT ($V_{DUT\_calc}(t)$) using the waveform at A and B. The next waveform 602 in FIG. 6 illustrates the resulting $V_{DUT\_calc}(t)$.

Step 3. Calculate the difference between the calculated DUT waveform and the expected DUT waveform. ($V_{err}(t)=V_{DUT\_calc}(t)-V_{exp}(t)$). The next waveform 604 in FIG. 6 illustrates the example $V_{err}(t)$.

Step 4. Set the source waveform to the signal generator so that $V_s(t)=V_{exp}(t)-V_{err}(t)$. The next waveform 606 in FIG. 5 illustrates the resulting example $V_s$ (t) as the flow converges towards a solution.

Step 5. Repeat the step 1-4 until the desired $V_{err}$ is obtained.

During steps 3-5, any appropriate search method can be used to minimize the $V_{err}$. For example, a linear search or a binary search can be used.

Figure 7:
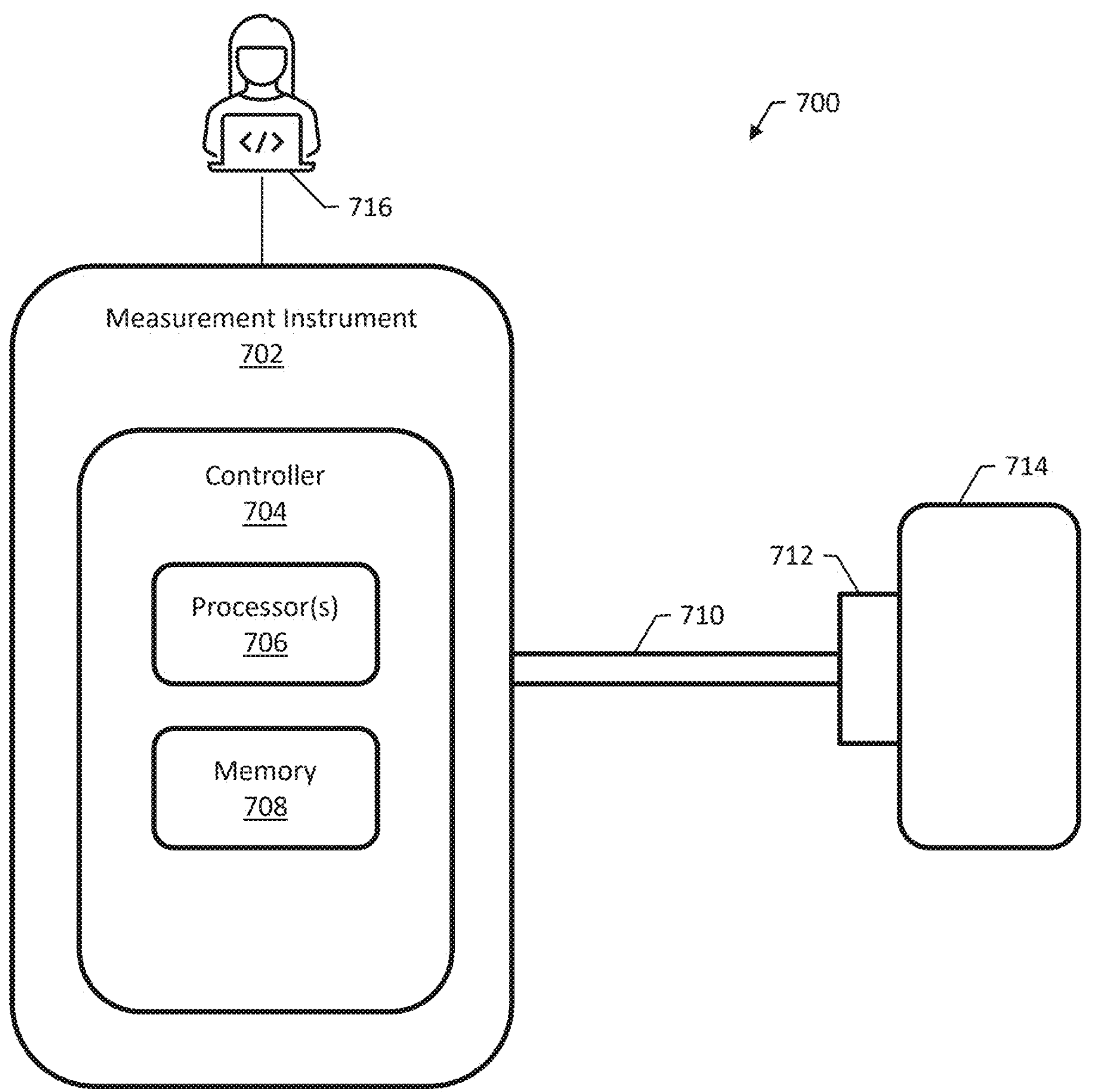
FIG. 7 illustrates an example system including a measurement instrument having a controller.

FIG. 7 illustrates an example system 700 including a measurement instrument 702 having a controller 704. The controller 704 can be implemented using any appropriate computing technology, for example, one or more processors 706 and memory 708 storing instructions for the processors 706. A coaxial cable 710 connects the measurement instrument 702 to a probe card 712 connected to a semiconductor wafer 714.

The semiconductor wafer 714 is a thin slice of semiconductor material, typically silicon, used as the substrate for microelectronic devices. The semiconductor wafer 714 can be fabricated through processes involving crystal growth, slicing, polishing, and doping to achieve precise electrical characteristics.

The standard wafer is circular, with diameters ranging from a few millimeters to several inches, and thicknesses of about 150 to 775 micrometers. The surface of the semiconductor wafer 714 undergoes chemical-mechanical polishing to ensure an ultra-flat, defect-free surface, useful for subsequent photolithographic patterning and etching steps in the semiconductor manufacturing process. The semiconductor wafer 714 serves as a platform for integrated circuits, where numerous microelectronic components are fabricated in a highly controlled, cleanroom environment.

The probe card 712 is a testing interface used in semiconductor wafer testing, serving as the intermediary between the wafer 714 and the test equipment. The probe card 712 can include an array of microscopic, precision-aligned probes that make direct electrical contact with the test pads or bumps on the wafer's surface.

A primary function of the probe card 712 is to facilitate the transmission of electrical signals between the semiconductor devices on the wafer 714 and the measurement instrument 702, enabling the assessment of device functionality and performance parameters. The probe card 712 is configured to ensure high accuracy, repeatability, and minimal signal degradation. In some examples, the probe card 712 includes a substrate, probe needles or cantilever beams, and a compliant interposer. A test engineer can use the probe card 712 to identify defects and validate the integrity of the integrated circuits prior to dicing and packaging.

The controller 704 can be configured to perform the calculations described above and control switches and other components of the example measurement systems described above. In some examples, the controller 704 executes test cases and produces test results for the semiconductor wafer 714 and one or more devices on the semiconductor wafer 714. For example, measured and calculated waveforms can be displayed on a display device 716 for a test engineer, and pass/fail test results can be displayed on the display device 716.

It will be understood that various details of the subject matter described herein may be changed without departing from the scope of the subject matter described herein. Furthermore, the foregoing description is for the purpose of illustration only, and not for the purpose of limitation, as the subject matter described herein is defined by the claims as set forth hereinafter.

What is claimed is:

1. A method comprising:

outputting an electrical signal from a signal generator of a measurement instrument;

measuring a first voltage at an input to an output resistance of the measurement instrument, wherein measuring the first voltage comprises:

closing a first switch between an analog-to-digital converter (ADC) and the input to the output resistance;

opening a second switch between the ADC and the output to the output resistance; and measuring the first voltage using the ADC;

measuring a second voltage at an output of the output resistance of the measurement instrument; and determining a test measurement voltage at a device under test (DUT) electrically connected to the measurement instrument using the first voltage, the second voltage, and a propagation delay of a transmission line electrically connecting the measurement instrument to the DUT.

2. The method of claim 1, wherein the DUT is a semiconductor device on a semiconductor wafer, and wherein the transmission line includes a coaxial cable.

3. The method of claim 1, wherein measuring the second voltage comprises:

opening the first switch and closing the second switch;

outputting the electrical signal a second time; and measuring the second voltage using the ADC.

4. The method of claim 1, comprising repeatedly outputting the electrical signal, adding an increasing time delay to each output of the electrical signal, and summing a plurality of waveforms captured at each time delay to determine a waveform at the DUT having a shorter sampling period than a configured sampling period of the ADC used for measuring the first voltage and the second voltage.

5. The method of claim 1, comprising capturing first and second waveforms for the first and second voltages for a period of time greater than twice the propagation delay of the transmission line.

6. The method of claim 1, comprising measuring the propagation delay of the transmission line using an oscilloscope.

7. The method of claim 1, wherein measuring the first voltage or the second voltage or both comprises using an oscilloscope.

8. A method comprising:

outputting an electrical signal from a signal generator of a measurement instrument;

measuring a first voltage at an input to an output resistance of the measurement instrument;

measuring a second voltage at an output of the output resistance of the measurement instrument;

determining a test measurement voltage at a device under test (DUT) electrically connected to the measurement instrument using the first voltage, the second voltage, and a propagation delay of a transmission line electrically connecting the measurement instrument to the DUT; and measuring a differential signal at the DUT by measuring a third voltage at a second input to a second output resistance and a further voltage at a second output to a second output resistance and using a second propagation delay of a second transmission line.

9. A system comprising:

a measurement instrument comprising a signal generator configured for outputting an electrical signal; and a controller configured for:

measuring a first voltage at an input to an output resistance of the measurement instrument, wherein measuring the first voltage comprises:

closing a first switch between an analog-to-digital converter (ADC) and the input to the output resistance;

opening a second switch between the ADC and the output to the output resistance; and measuring the first voltage using the ADC;

measuring a second voltage at an output of the output resistance of the measurement instrument; and determining a test measurement voltage at a device under test (DUT) electrically connected to the measurement instrument using the first voltage, the second voltage, and a propagation delay of a transmission line electrically connecting the measurement instrument to the DUT.

10. The system of claim 9, wherein the DUT is a semiconductor device on a semiconductor wafer, and wherein the transmission line includes a coaxial cable.

11. The system of claim 9, wherein measuring the second voltage comprises:

opening the first switch and closing the second switch;

outputting the electrical signal a second time; and measuring the second voltage using the ADC.

12. The system of claim 9, wherein the controller is configured for repeatedly outputting the electrical signal, adding an increasing time delay to each output of the electrical signal, and summing a plurality of waveforms captured at each time delay to determine a waveform at the DUT having a shorter sampling period than a configured sampling period of the ADC used for measuring the first voltage and the second voltage.

13. The system of claim 9, wherein the controller is configured for capturing first and second waveforms for the first and second voltages for a period of time greater than twice the propagation delay of the transmission line.

14. The system of claim 9, wherein the controller is configured for measuring the propagation delay of the transmission line using an oscilloscope.

15. The system of claim 9, wherein measuring the first voltage or the second voltage or both comprises using an oscilloscope.

16. A system comprising:

a measurement instrument comprising a signal generator configured for outputting an electrical signal; and a controller configured for:

measuring a first voltage at an input to an output resistance of the measurement instrument;

measuring a second voltage at an output of the output resistance of the measurement instrument; and determining a test measurement voltage at a device under test (DUT) electrically connected to the measurement instrument using the first voltage, the second voltage, and a propagation delay of a transmission line electrically connecting the measurement instrument to the DUT, wherein the controller is configured for measuring a differential signal at the DUT by measuring a third voltage at a second input to a second output resistance and a further voltage at a second output to a second output resistance and using a second propagation delay of a second transmission line.

* * * * *